(12) United States Patent
Wissel

(10) Patent No.: US 7,345,943 B2
(45) Date of Patent: Mar. 18, 2008

(54) UNCLOCKED EFUSE CIRCUIT

(75) Inventor: Larry Wissel, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/426,951

(22) Filed: Jun. 28, 2006

(65) Prior Publication Data

US 2008/0002450 A1    Jan. 3, 2008

(51) Int. Cl.
*G11C 17/18* (2006.01)

(52) U.S. Cl. .............. 365/225.7; 365/189.03; 327/525

(58) Field of Classification Search ............ 365/225.7, 365/189.03, 189.11; 327/525
See application file for complete search history.

(56) References Cited

U.S. PATENT DOCUMENTS

| 6,639,848 B2* | 10/2003 | Maejima ............... 365/189.07 |
| 6,747,481 B1* | 6/2004 | Pitts ........................ 326/41 |
| 7,061,304 B2* | 6/2006 | Anand et al. ............... 327/525 |
| 7,095,671 B2* | 8/2006 | Krishnan et al. ......... 365/225.7 |
| 7,098,721 B2* | 8/2006 | Ouellette et al. ........... 327/525 |

* cited by examiner

*Primary Examiner*—Richard T. Elms
*Assistant Examiner*—Hien N Nguyen
(74) *Attorney, Agent, or Firm*—Cantor Colburn LLP; Blake Dorr

(57) ABSTRACT

An unclocked electrically programmable fuse (eFUSE) system includes at least two resistive voltage dividers, one voltage divider including an eFUSE, and a differential amplifier. An output node of at least one of the voltage dividers includes an eFUSE that changes an output voltage based on a state of the eFUSE, and the differential amplifier changes the output voltage into a digital output with no clocking capabilities.

3 Claims, 1 Drawing Sheet

UNCLOCKED EFUSE CIRCUIT

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to semiconductor devices, and particularly to a method for using an unclocked eFUSE (Electrically Programmable Fuse) circuit.

2. Description of Background

Electrically Programmable Fuses (eFUSEs) are widely used to implement memory redundancy functionality in dynamic random access memory (DRAM), static random access memory (SRAM), and embedded memory devices. Passing a sufficient current through an eFUSE structure typically programs the eFUSE, such that its resistance is significantly altered from its initially fabricated state. In order to determine whether a particular fuse has been programmed or not, a sense circuit may be used to detect one of two possible "states" of the fuse. More specifically, the sense circuit holds one of two latched values therein, which is driven by a comparison between an applied voltage (by the sense circuit) across the fuse and a reference voltage generated within the sense circuit. The reference voltage is designed to be between a fuse voltage corresponding to the programmed state and a fuse voltage corresponding to an unprogrammed state.

However, it is common for registers to be part of scan chains for test. In a particular military application, it is essential that no amount of hacking can cause the contents of internal registers to be scanned out. To accomplish this, a technique is required to use an unblown eFUSE to enable scan for test, but then to blow the eFUSE at the conclusion of test to disable scan. The eFUSE implementation must be extremely simple, and it must be unclocked so that it passes conservative military design reviews with consensus "100% certainty" that it will disable scan. Existing eFUSE macros are all clocked, and therefore they open the door that hacking could power up the chip without clocking the eFUSE macro and thereby leave scan enabled, accessing the internal registers. The exemplary embodiments of the present invention eliminate that exposure, and are simpler and smaller than a clocked eFUSE macro.

Considering the limitations of the above-mentioned methods, it is clear that there is a need for an unclocked eFUSE circuit.

SUMMARY OF THE INVENTION

The shortcomings of the prior art are overcome and additional advantages are provided through the provision of an unclocked electrically programmable fuse (eFUSE) system including at least two resistive voltage dividers, one voltage divider including an eFUSE, and a differential amplifier. An output node of at least one of the voltage dividers includes an eFUSE that changes an output voltage based on a state of the eFUSE, and the differential amplifier changes the output voltage into a digital output with no clocking capabilities.

Additional features and advantages are realized through the techniques of the present invention. Other embodiments and aspects of the invention are described in detail herein and are considered a part of the claimed invention. For a better understanding of the invention with advantages and features, refer to the description and the drawings.

TECHNICAL EFFECTS

As a result of the summarized invention, technically we have achieved a solution that provides for an unclocked eFUSE circuit.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Figure 1:
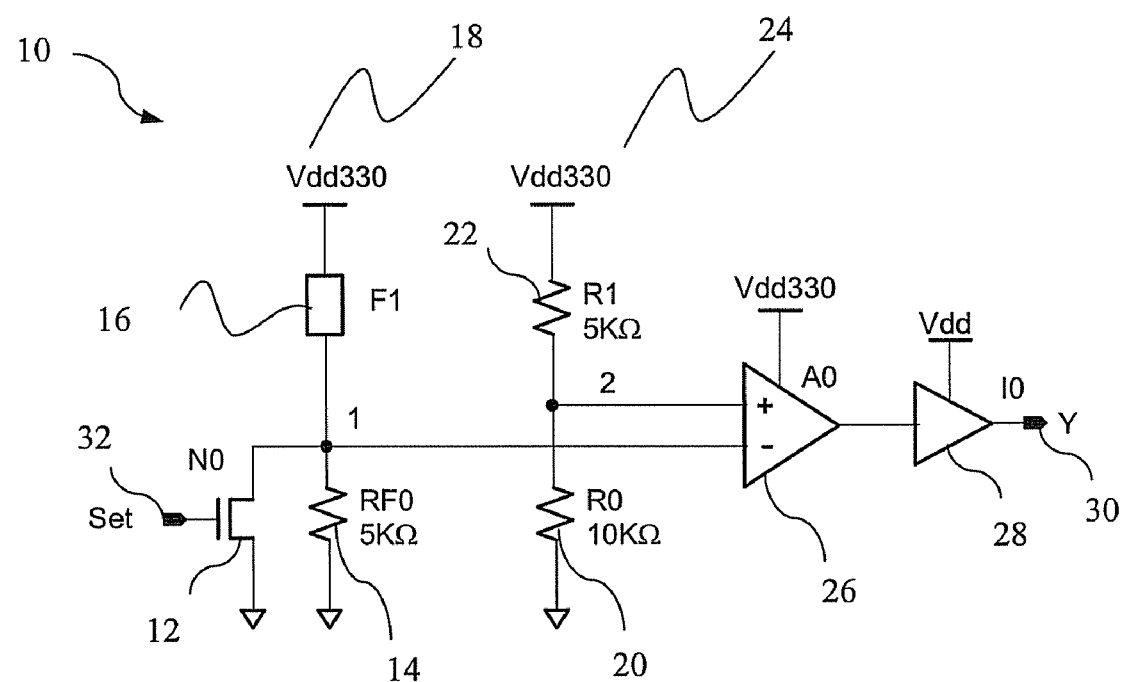
FIG. 1 is a schematic diagram illustrating one example of an unlocked eFUSE circuit, in accordance with an embodiment of the invention.

One aspect of the exemplary embodiments is a construction of an unclocked eFUSE circuit.

In the exemplary embodiments, the eFUSE is a resistor in a voltage-divider circuit. The voltage-divider output node voltage changes based on the state (unblown or blown) of the eFUSE, and an amplifier turns this voltage into a corresponding digital output with no clocking. This output can serve as a gating signal to disable scan. One objective is to construct two resistive voltage dividers, with one of the resistances being an eFUSE. The internal nodes of the voltage dividers represent an input signal to a differential amplifier (DiffAmp). One node will always be the same, but the other node will be higher or lower depending on the state (unblown or blown) of the fuse.

FIG. 1 is one example of an unlocked eFUSE circuit 10. The elements of circuit 10 include: a Set input pin 32, a single NMOS transistor 12 (N0), a resistor 14 (RF0=5 KΩ), a fuse 16 (F1), a Vdd330 power supply 18, a resistor 20 (R0=10 KΩ), a resistor 22 (R1=5 KΩ), a Vdd330 power supply 24, an amplifier 26, a gain 28, and an output 30 (Y).

Referring to FIG. 1, when the eFUSE is blown, F0 will change from unblown resistance 150Ω to blown resistance of 500 KΩ (typical; there is a distribution of lesser values possibly down to 10 KΩ). A0 registers a positive input (V1<V2) and output 30 (Y) is high. As shown with blown resistance 10 KΩ, V1=1.10V and V2=2.2V. When eFUSE F0 in FIG. 1 is unblown, its resistance is about 150Ω, DiffAmp A0 in FIG. 1 registers a negative input (V1>V2) and output 30 (Y) is low. As shown with unblown resistance 150Ω, V1=3.20V and V2=2.2V.

The mechanism to blow the fuse consists of the common Vdd330 power supply 18, eFUSE F0, a Set input pin 32, and a single NMOS transistor 12 (N0) capable of sinking 12 mA from the eFUSE. A 200 us pulse on the Set input causes current of N0 to blow F0. The circuitry is connected to 3.3V (Vdd330) to provide the sustained current to blow the fuse.

The value of RF0 has a two constraints to establish a lower bound:

1. To limit the pre-blow voltage-divider current to a value, which will not approach the 12 mA blow current. A value as low as 3 KΩ limits the current to 1 mA.

2. To maintain V1>V2 even if the unblown resistance is larger than typical. Even if the unblown resistance were as high as 500Ω, a value as low as 3 KΩ also satisfies this.

The value of RF0 has one constraint to establish an upper bound: to maintain V1<V2 post-blow even if the post-blow resistance of F is as low as 10 KΩ. A value as high as 10 KΩ satisfies this. Thus, there is considerable margin in the range of acceptable RF0 values: 3 KΩ<RF0<10 KΩ. The resistance values of R0 and R1 are also not critical, and adequate tracking is easily achieved.

Many configurations of DiffAmps with outputs buffers to enable a full-swing output with respect to Vdd330 are known. I0 simply reduces the 3.3V signal to a lower Vdd signal so that this circuit can interface to thin-oxide transistors. All transistors indicated in FIG. 1 are thick-oxide transistors to tolerate Vdd330 on one or more terminals.

A wide tolerance of pre-blow eFUSE resistances is acceptable. The typical unblown resistance is 150Ω, but the output Y will respond properly to a value as high as 1 KΩ. However, the fuse would not blow properly if it had such high initial resistance.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An unclocked electrically programmable fuse (eFUSE) system, the system comprising:
    at least two resistive voltage dividers, one voltage divider including an eFUSE; and
    a differential amplifier;
    a NMOS transistor having an open position, a closed position, and no clocking capabilities;
    wherein an output node of at least one of the voltage dividers including an eFUSE that changes an output voltage based on a state of the eFUSE; and
    wherein the differential amplifier changes the output voltage into a digital output and operates when the NMOS transistor is in the open position and the closed position.

2. The system of claim 1, wherein the state of the eFUSE is blown.

3. The system of claim 1, wherein the state of the eFUSE is unblown.

* * * * *